(12) United States Patent
Kroeze et al.

(10) Patent No.: US 8,493,018 B2
(45) Date of Patent: Jul. 23, 2013

(54) FAST SWITCHING FOR POWER INVERTER

(75) Inventors: Ryan Kroeze, San Jose, CA (US); Colin Campbell, San Francisco, CA (US); Nicholas Robert Kalayjian, San Carlos, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 304 days.

(21) Appl. No.: 13/018,391

(22) Filed: Jan. 31, 2011

(65) Prior Publication Data

US 2012/0194119 A1 Aug. 2, 2012

(51) Int. Cl.
*H02P 1/30* (2006.01)
*H02P 3/00* (2006.01)

(52) U.S. Cl.
USPC ........ 318/503; 318/254.1; 318/430; 318/632; 361/90; 361/91.1

(58) Field of Classification Search
USPC .............. 318/503, 632, 702, 802, 400.06, 318/807, 430, 254.1; 363/55, 98, 127; 322/22; 361/90, 91.1
See application file for complete search history.

(56) References Cited

U.S. PATENT DOCUMENTS

| | | | | |
|---|---|---|---|---|
| 5,592,371 A * | 1/1997 | Rajashekara et al. | ........... | 363/98 |
| 5,594,634 A * | 1/1997 | Rajashekara et al. | ........... | 363/98 |
| 5,717,584 A * | 2/1998 | Rajashekara et al. | ........... | 363/98 |
| 7,245,102 B1 * | 7/2007 | Spong et al. | ................... | 318/632 |
| 7,692,940 B2 * | 4/2010 | Ochiai et al. | ................... | 363/98 |
| 7,768,807 B2 * | 8/2010 | Chen et al. | ................... | 363/127 |
| 7,898,208 B2 * | 3/2011 | Ochiai et al. | ................... | 318/760 |
| 7,956,561 B2 * | 6/2011 | Kanamori et al. | ........ | 318/400.06 |
| 7,956,590 B2 * | 6/2011 | Zafarana et al. | ............... | 323/282 |
| 8,232,760 B2 * | 7/2012 | Lu et al. | ......................... | 318/807 |
| 2006/0214672 A1 * | 9/2006 | Jenkins et al. | ................. | 324/713 |
| 2007/0229049 A1 * | 10/2007 | Zafarana et al. | ............... | 323/282 |
| 2007/0236205 A1 * | 10/2007 | Zambetti et al. | ............... | 323/320 |
| 2008/0036477 A1 * | 2/2008 | Jenkins et al. | ................. | 324/713 |
| 2008/0284387 A1 * | 11/2008 | Chen et al. | ....................... | 323/222 |
| 2008/0297079 A1 * | 12/2008 | Kanamori et al. | ........ | 318/400.06 |
| 2009/0001911 A1 * | 1/2009 | Kayikci et al. | .............. | 318/254.1 |
| 2009/0108794 A1 * | 4/2009 | Ochiai et al. | ................... | 318/760 |
| 2009/0128117 A1 * | 5/2009 | Ochiai et al. | ................... | 323/299 |
| 2010/0072958 A1 * | 3/2010 | Wada et al. | ...................... | 322/22 |
| 2010/0295476 A1 * | 11/2010 | Franco | ........................... | 315/297 |
| 2010/0315033 A1 * | 12/2010 | Lu et al. | ......................... | 318/702 |
| 2010/0315034 A1 * | 12/2010 | Lu et al. | ......................... | 318/802 |
| 2012/0147628 A1 * | 6/2012 | Pollock et al. | ................... | 363/13 |
| 2012/0195079 A1 * | 8/2012 | Kroeze et al. | .................... | 363/55 |

* cited by examiner

*Primary Examiner* — Paul Ip
(74) *Attorney, Agent, or Firm* — J. Richard Soderberg

(57) ABSTRACT

An apparatus includes an inverter including a high-side switch coupled to a low-side switch, the inverter generating a time-varying drive current from a plurality of drive control signals, a positive rail voltage, and a negative rail voltage wherein controlling the switches to generate the time-varying drive current produces a potential transitory overshoot condition for one of the switches of the inverter; a drive control, coupled to the inverter, to generate the drive control signals and to set a level of each of the rail voltages responsive to a plurality of controller signals; and a controller monitoring one or more parameters indicative of the potential transitory voltage overshoot condition, the controller dynamically adjusting, responsive to the monitored parameters, the controller signals to reduce a risk of occurrence of the potential transitory voltage overshoot condition.

20 Claims, 12 Drawing Sheets

FAST SWITCHING FOR POWER INVERTER

CROSS REFERENCE TO RELATED APPLICATIONS

The present application is a continuation of U.S. patent application Ser. No. 13/018,371, and related to U.S. patent application Ser. No. 13/018,379, and U.S. patent application Ser. No. 13/018,387, all filed on the same date with the same title. The contents and disclosures of all these applications are hereby expressly incorporated in their entireties by reference thereto for all purposes.

BACKGROUND OF THE INVENTION

The present invention relates generally to switching of semiconductor power devices, and more specifically to selectively decreasing excessive voltage overshoot during fast turn-off of hard-switched high voltage semiconductor power devices.

There are many applications for high-speed switching of semiconductor power devices. Some applications are referred to as soft-switched (whether active or passive) and some are referred to as hard-switched. Hard-switching applications are those that turn a device OFF while current flows through the device, such as, for example, into an inductive load. One such application includes three-phase inverters for DC-AC power conversion and motor control in HEVs, PHEVs, and EVs. These inverters include three separate half-bridges having a high-side voltage switching element and a low-side voltage switching element, each with anti-parallel diodes. IGBTs and MOSFETs are two of the typical semiconductor switching devices used in this context. To decrease power losses, and improve inverter efficiency, silicon power devices are designed to switch quickly between on and off states. Switching the devices on and off introduces voltage and current transients (dV/dt and dI/dt) into the system. Faster switching decreases the IGBT/MOSFET turn-on and turn-off losses, but increases the associated dV/dt and dI/dt transients.

A typical system includes parasitic inductances and a DC link capacitance coupled to the switching element(s). Fast dI/dt transients produce voltages across the inductances, which are added to a DC link voltage. These cumulated voltages exist directly across the power device(s) which is/are switching from its "ON" state to its "OFF" state. Should the cumulated voltage become larger than the rated voltage of the device, the semiconductor material breaks down and the device is destroyed. The cumulative additional voltages are referred to as voltage overshoot (it overshoots the applied/desired voltage). Typically there is a larger overshoot during device turn-off, therefore the discussion herein focuses on the transients seen while a device is turning off. Some of the inventive ideas presented herein may be useful in various contexts for device turn on.

FIG. 1 is a block schematic diagram of a conventional three phase inverter 100 including a DC source 105, a DC link capacitance 110, three half bridges 115$_n$, and three inductances 120$_n$ in a star-connected configuration representing a load, such as, for example, the windings of an electric motor. FIG. 1 also schematically represents various system parasitic inductances typically seen between the single phase half-bridge switching devices 115$_x$ and DC link capacitor 110. Not shown in FIG. 1 are the specific positive and negative controls for controlling the switches (e.g., gate voltages) of half-bridges 115$_n$.

These inductances include L$_{CAP}$, L$_{BUS}$, and L$_n$ (n=1,2,3), and, for an IGBT (L$_C$, L$_E$), and for a MOSFET (L$_D$, L$_S$). L$_{CAP}$ is inherent to the lead or terminal structure attaching the capacitive element to a busbar or FR4 board. L$_{BUS}$ includes the inductance from the busbar or FR4 board between the switching device leads and capacitor terminal structure. L$_C$/L$_D$ includes the device lead and case inductance for the collector (IGBT) or drain (MOSFET) or and L$_S$/L$_E$ includes the device lead and internal bond wire for the source (MOSFET) or emitter (IGBT). L$_n$ includes a primary side referenced stator leakage inductance for each phase.

The following discussion and equations address operation of one phase (e.g., first phase leg 120$_1$). It is assumed that the inductance of phase leg 120$_1$, L$_1$, is much larger than the other parasitic inductances in the system, and that DC link capacitance 110 is sufficiently large to prevent a change in the DC link bus voltage. When the gate of the upper switch device in half-bridge 115$_1$ changes from a high to low voltage, the device begins its process of turning off. It is assumed that since L$_1$ is large, the motor current I$_1$ will not change during the device turn-off period. Before the upper device begins its turn-off sequence, the voltage across it equals the device's on-state voltage when carrying I$_1$, while the lower device's voltage equals the DC link voltage. Since the lower switch device's anti-parallel diode must carry the current after the upper device turns off, which will not happen until the diode reaches its V$_f$ threshold voltage, the upper device's terminal voltage must ramp up from its previous on-state voltage to carry the DC link voltage. After the upper device is carrying the DC link voltage, the lower device's diode ramps up in current and the upper device ramps down in current, until the upper device is fully blocking and the lower diode is fully conducting I$_1$. The time for the current to ramp down in the upper device is a primary function of previous conducted current, I$_1$, the system parasitic inductance, and the magnitude of the negative voltage rail. Equation (1) and (2) calculate the voltage on the collector/drain and emitter/source respectively; equation (3) depicts the voltage seen across the upper switch as of function of the DC link voltage, parasitic inductance, and change in switch current during turn-off.

$$V_{SWITCH+} = V_{DClink} - \left(\frac{1}{2}L_{CAP} + \frac{1}{2}L_{BUS} + L_C\right)*\frac{-dI}{dt} \quad (1)$$

$$V_{SWITCH-} = 0 - \left(\frac{1}{2}L_{CAP} + \frac{1}{2}L_{BUS} + L_C + L_E\right)*\frac{dI}{dt} + L_E*\frac{-dI}{dt} \quad (2)$$

$$V_{SWITCH-} = 0 - \left(\frac{1}{2}L_{CAP} + \frac{1}{2}L_{BUS} + L_C + L_E\right)*\frac{dI}{dt} + L_E*\frac{-dI}{dt} \quad (3)$$

Typically, in order to prevent the overshoot voltage during device turn-off from exceeding the device voltage rating, the bus voltage is maintained below the device rating plus the worse case overshoot. If a higher DC link bus voltage is required, many systems simply replace the switching device(s) with a larger rated device. For systems that desire to reduce the overshoot to safe levels, the device turn-off switching state must be slowed down. Using larger gate resistors is the simplest approach to slowing down the turn-off of a device, which is documented in many manufacturers' device datasheets.

Production electric vehicles must have the best efficiency and performance at the lowest cost and weight. Production electric vehicles rely on many very high voltage switching devices that switch as fast as possible. It is not desired to simply increase the rated sizes of the device just to address voltage overshoot concerns. It is not always the case that the voltage will overshoot, and the unused extra size capacity adds unnecessary costs, and may add some incremental extra weight which, cumulatively, is disadvantageous. Slowing down the switching state by changing gate resistance increases the device switching losses, which decreases the efficiency of the inverter and system because these solutions have the increased gate resistance in circuit all the time.

What is needed is a system and method for dynamic control of a gate drive negative voltage rail to efficiently and economically reduce excessive voltage overshoot.

BRIEF SUMMARY OF THE INVENTION

Disclosed is a system and method for dynamic control of a gate drive negative rail voltage to efficiently and economically reduce excessive voltage overshoot. An apparatus includes an inverter including a high-side switch coupled to a low-side switch, the inverter generating a time-varying drive current from a plurality of drive control signals, a positive rail voltage, and a negative rail voltage wherein controlling the switches to generate the time-varying drive current produces a potential transitory overshoot condition for one of the switches of the inverter; a drive control, coupled to the inverter, to generate the drive control signals and to set a level of each of the rail voltages responsive to a plurality of controller signals; and a controller monitoring one or more parameters indicative of the potential transitory voltage overshoot condition, the controller dynamically adjusting, responsive to the monitored parameters, the controller signals to reduce a risk of occurrence of the potential transitory voltage overshoot condition.

A method includes the steps of a) generating a time-varying drive current from a plurality of drive control signals, a positive rail voltage, and a negative rail voltage wherein the time-varying drive current produces a potential transitory overshoot condition for a switch of an inverter; b) generating the drive control signals and setting a level of one or more of the rail voltages for the inverter responsive to a plurality of controller signals; c) monitoring one or more parameters indicative of the potential transitory voltage overshoot condition; and d) adjusting dynamically, responsive to the monitored parameters, the controller signals to at least reduce a risk of occurrence of the potential transitory voltage overshoot condition.

A method includes the steps of a) calculating a maximum available voltage overshoot for an inverter producing a time-varying drive current; b) determining a current voltage overshoot for the inverter responsive to the time-varying drive current; c) operating the inverter in a first operational mode for minimization of switching losses when the current voltage overshoot is not greater than the maximum available voltage overshoot while increasing a risk of occurrence of a potential transitory voltage overshoot condition destructive to the inverter; and d) operating the inverter in a second operational mode for minimization of the risk of occurrence of the potential transitory voltage overshoot condition when the current voltage overshoot is greater than the maximum available voltage overshoot while increasing switching losses.

The preferred implementations of the present invention include systems and methods for dynamically reducing voltage overshoot in semiconductor driver circuits. The described embodiments of the present invention use control algorithms to vary the negative bias voltage rail which turns off IGBT and MOSFETs. The time it takes for the device to turn-off varies with the negative rail voltage potential; this feature also limits the device dI/dt turn-off rate and can be used to limit the device voltage overshoot. Device datasheets do not contain definitive parameters or data showing this effect, partially since device overshoot is a strong function of the parasitic inductance in the system surrounding the devices. Existing control topologies have used device drivers which clamp the negative bias rail to zero volts in order to protect devices during a fault state. The described control algorithm is beneficial since it limits device overshoot during normal device operating conditions, limits device powerloss, and maximizes the use of the DC bus voltage.

Multiple exemplary solutions are included that control a dI/dt transition as a function of I, preferably during device turn-off. Typically, a negative gate voltage is applied to both prevent accidental device turn-on and increase the device dI/dt transition during device turn-off. A fixed gate resistance is chosen that produces an acceptable switching loss vs. DC switch current behavior at a given negative bias voltage. When a resulting overshoot on the device is too large (for the requested drive current and required bus voltage), then the magnitude of the turn-off voltage is decreased during that higher drive current state. A preferred implementation includes three drivers, one driver for each phase of a three-phase electric motor, for use in an electric vehicle. When the three phase inverter is driving a motor with essentially sinusoidal current, typically the negative voltage rail will only need to decrease in magnitude around the peaks of the current; other portions of the sine wave will use the normal magnitude for the negative voltage rail. These solutions maximize a use of the bus voltage while minimizing turn-off switching losses and reducing, if not eliminating, a risk of exceeding the breakdown voltage of the semiconductor driver transistors. Embodiments of the present invention are adapted for both instantaneous and low-pass filtered implementations, as well as responsiveness to additional parameters, such anticipated increased drive current and junction temperature of the semiconductor devices, all within the scope of the present invention.

Other features, benefits, and advantages of the present invention will be apparent upon a review of the present disclosure, including the specification, drawings, and claims.

DETAILED DESCRIPTION OF THE INVENTION

Embodiments of the present invention provide methods and systems for a system and method for dynamic control of a gate drive negative voltage rail to efficiently and economically reduce excessive voltage overshoot. The following description is presented to enable one of ordinary skill in the art to make and use the invention and is provided in the context of a patent application and its requirements. In the following text, the terms "energy storage assembly," "battery," "cell," "battery cell," "battery cell pack," "electrolytic double-layer capacitor," and "ultracapacitor" may be used interchangeably (unless the context indicates otherwise" and may refer to any of a variety of different rechargeable configurations and cell chemistries including, but not limited to, lithium ion (e.g., lithium iron phosphate, lithium cobalt oxide, other lithium metal oxides, etc.), lithium ion polymer, nickel metal hydride, nickel cadmium, nickel hydrogen, nickel zinc, silver zinc, or other chargeable high energy storage type/configuration.

Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Embodiments of the present invention are applicable to systems that employ high-energy electric motors in general, and more specifically to vehicles using multiphase electric induction motors. Electric vehicles (EVs) include vehicles that have one or more sources of stored energy designed to provide electrical energy to the vehicle, wherein the electrical energy is used to at least in part to provide some energy used to propel the vehicle. Electric vehicles may include vehicles designed to carry passengers, to transport goods, or to provide specialty work capabilities. For example, electric vehicles include passenger automobiles, trucks, and recreational watercrafts such as boats. In addition, electric vehicles include specialty vehicles, such as fork trucks used to lift and move cargo, vehicles that incorporate conveyor belts to move objects, such as mobile conveyor belt vehicles used to load and unload cargo such as luggage from airplanes, and specialty equipment used in areas where exhaust fumes from typical gasoline, diesel, or propane powered equipment may present hazards to personnel, such as in underground mining operations. In various instances, electric vehicles are designed and intended to be operated on public highways as licensed automobiles, including both cars and trucks.

Figure 2:
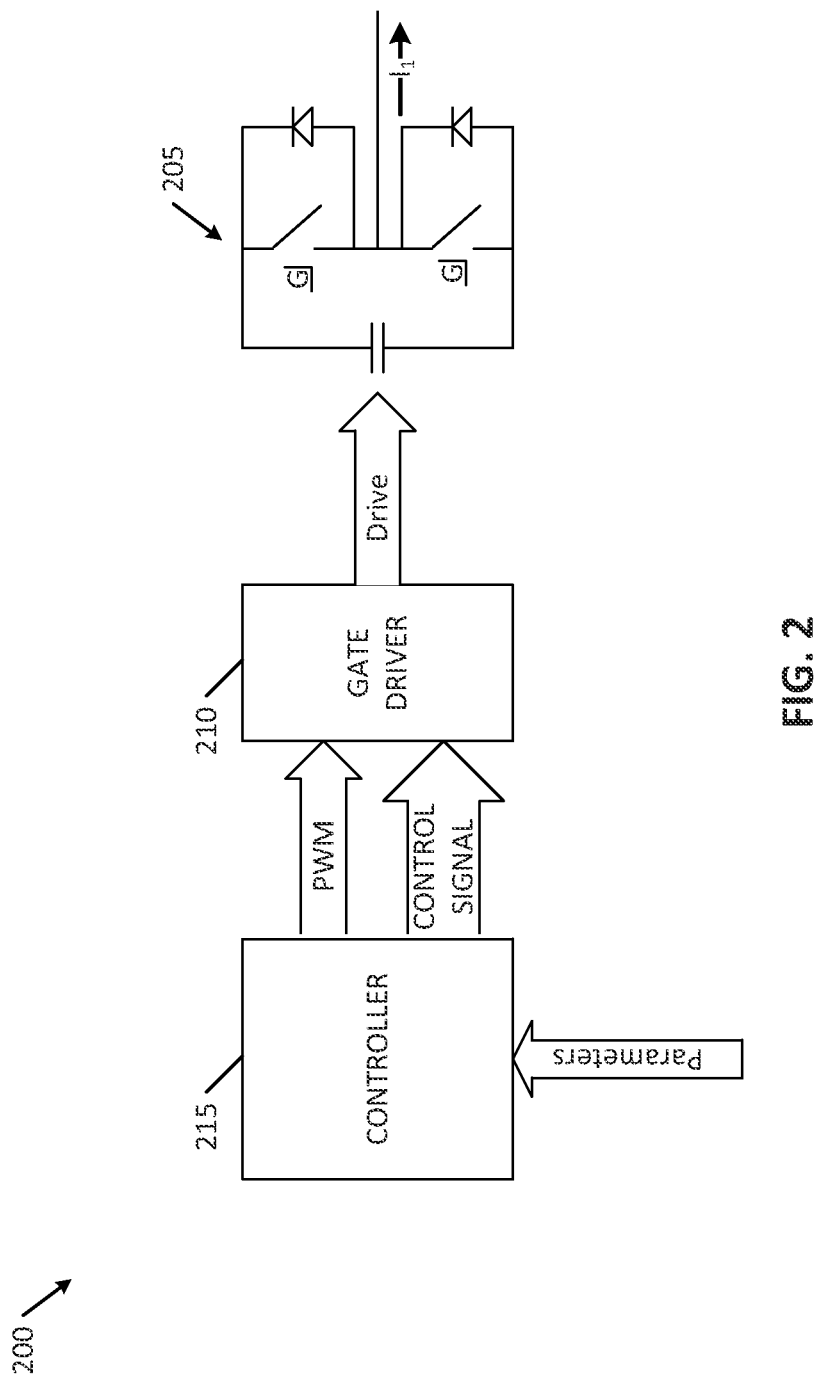
FIG. 2 is a general block schematic diagram of a semiconductor driver system.

FIG. 2 is a general block schematic diagram of a semiconductor driver system 200. System 200 includes an inverter 205 (e.g., a multi-level structure or a half-bridge structure) responsive to drive control signals from a gate driver 210 which, in turn, is responsive to controller signals (e.g., pulse width modulation (PWM), one or more other control signals, and/or the like) from a controller 215. System 200 is a generalized template for the described embodiments and methods further described in detail herein.

Figure 1:
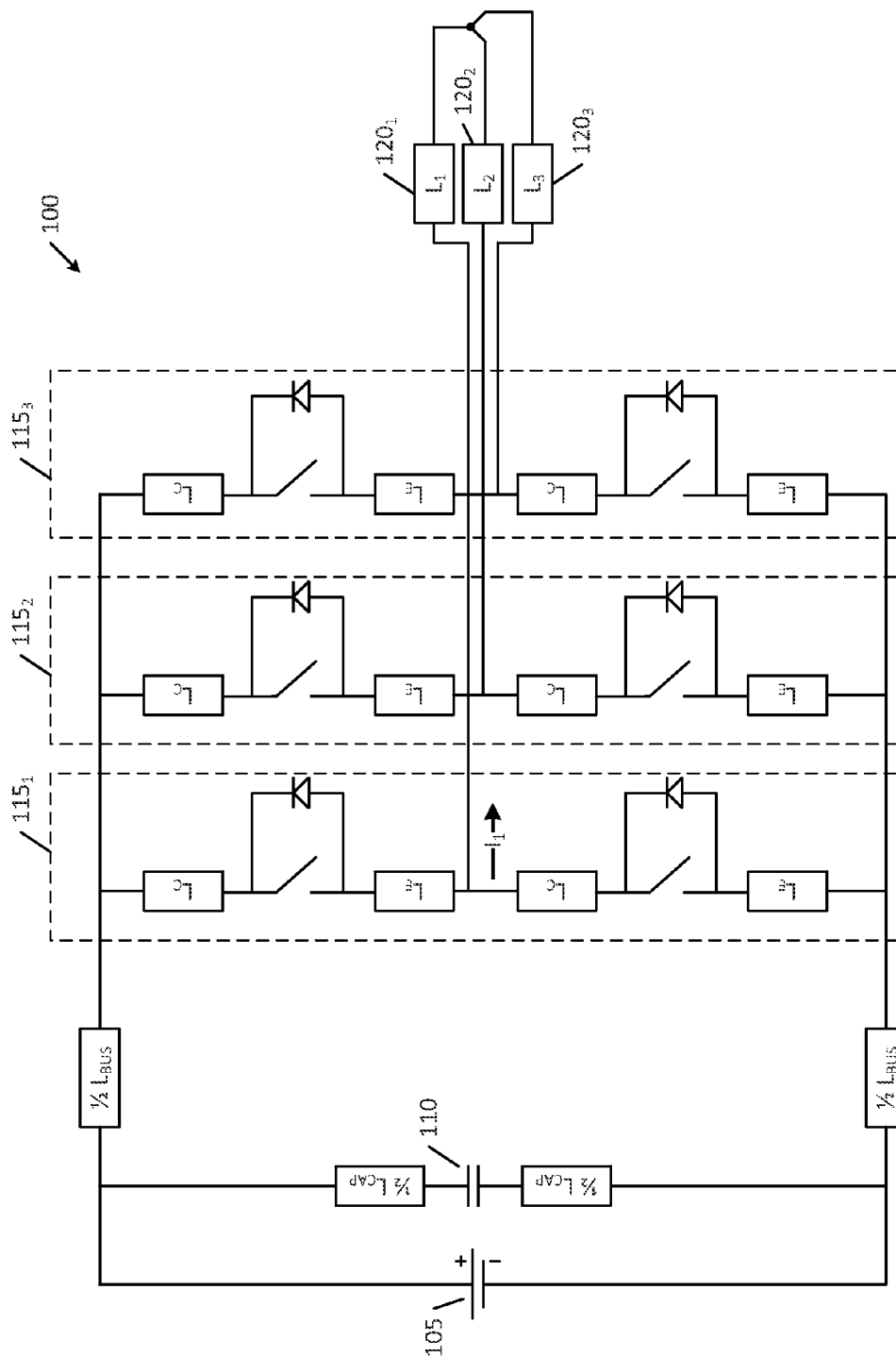
FIG. 1 is a block schematic diagram of a conventional three phase inverter including a DC source, a DC link capacitance, three half bridges, and three inductances in a star-connected configuration representing a load, such as, for example, windings of an electric motor.

Inverter 205 of the preferred embodiment may use similar elements to the driver and DC link capacitance shown in FIG. 1, so in the interests of simplifying the discussion, inverter 205 is shown as a single half-bridge which represents inverters and switching systems of all sorts that could be protected using the present invention. While system 200 includes a single inverter 205, it is understood that a preferred embodiment includes three inverters 205 (in some cases, some refer to the three phases as being the inverter), each coupled to a phase of a three-phase electric motor such as used in an electric vehicle or other industrial application. Inverter 205 produces a time-varying drive current $I_x$. This drive current, for electric motor control, is preferred to have a fundamental sinusoid waveform with a relatively constant frequency but having an amplitude that varies depending upon several factors, predominately a desired level of output drive current. Thus time-varying in this context means variable amplitude. For the preferred application of use in an EV or the like with the three-phase traction motor, there are three drive currents and they collectively control a torque on the electric traction motor.

Inverter 205 includes at least a pair of power switches (a high-side switch and a low-side switch) that switch nominal 400 volts with sub-microsecond switching speed. The present invention could be applicable with slower switching when significant risk exists for inverter 205. This is without accounting for the induced voltage arising from the parasitic inductance which can easily exceed a device breakdown voltage for devices like this which is typically rated at about 600 volts, though other voltages are within the scope of the present invention. Driver 205 includes an anti-parallel diode across each switch and the DC link capacitance coupling the input bus (i.e., a high-side $V_{HIGH\_SUPPLY}$ coupled to a low-side $V_{LOW\_SUPPLY}$).

Drive control signals from gate driver 210 cause inverter 205 to generate the time-varying drive current $I_x$. The drive control signals are applied to the gates of the switches and use pulse-width-modulation (PWM) to define the desired output for the drive current. Gate driver 210 is responsive to one or more controller signals (shown as PMW signals and other control signal) provided from controller 215. Depending upon implementation, gate driver 210 includes any DC bias supply isolation, DC bias supply regulation mechanism, and driver electronics/devices.

These controller signals from controller 215 cause gate driver to set DC bias supply voltages (e.g., positive and negative rail voltages) and gate signals applied to the switches (or components thereof) of inverters 205. In general, controller 215 receives one or more input parameters from the system and determines whether to change a default operation to account for a risk of a potential transitory voltage overshoot condition. The risk may be small or large, the overshoot may be small or large, and the condition may indicate a real-time, cautionary, or anticipatory potential overshoot condition. Controller 215 monitors and dynamically adjusts, as necessary or desirable in the context of the particular implementation. Controller 215 is contemplated to be implemented broadly by many different combinations of active and passive elements. To the extent that a controller, in some contexts, refers to a particular collection of active devices, then controller 215 is a more expansive term as it may include passive devices, and the active/passive devices of controller 215 maybe integrated or discrete. The components may be consolidated at a single location/assembly or distributed among different systems. In some cases, specific protective elements are integrated into the inverter(s) or into the gate driver(s). Some implementations may be implemented as a retrofit over an existing design having a PWM generating controller by adding overshoot protection elements completely independent of the existing controller.

Many different methods and systems are described herein to provide a broad overview and an indication of a scope of the different embodiments and implementations of the present invention. Specifics of controller 215 vary based upon the type of dynamic overshoot control that is desired.

In general, controller 215 receives two parameters, typically all from inverter 205. These parameters include a sampled sinusoidal drive current $I_1$, as well as a differential bus voltage across the DC link. Some implementations may include fewer, more, or different parameters than these parameters, some of which are detailed and described herein. Controller 215 outputs high and low side PWM signals and analog or serial data for controlling a variable voltage regulation mechanism of gate driver 210. The voltage regulation is used, in the preferred embodiments, to set/change a negative rail voltage. With no or low risk of voltage overshoot, the negative rail voltage is set to minimize switching losses/maximize switching efficiencies (including providing the fastest switching) during this first or primary operational mode. When there is a substantial enough risk of voltage overshoot (dependent upon specifics of the embodiment/implementation as to what is a substantial risk), a magnitude of the negative rail voltage is reduced to reduce/limit/eliminate any risk of the voltage overshoot. However the switching efficiency is decreased and losses are increased during this second or secondary operational mode. Generally this secondary operational mode is only required during peaks of the drive current.

Figure 3:
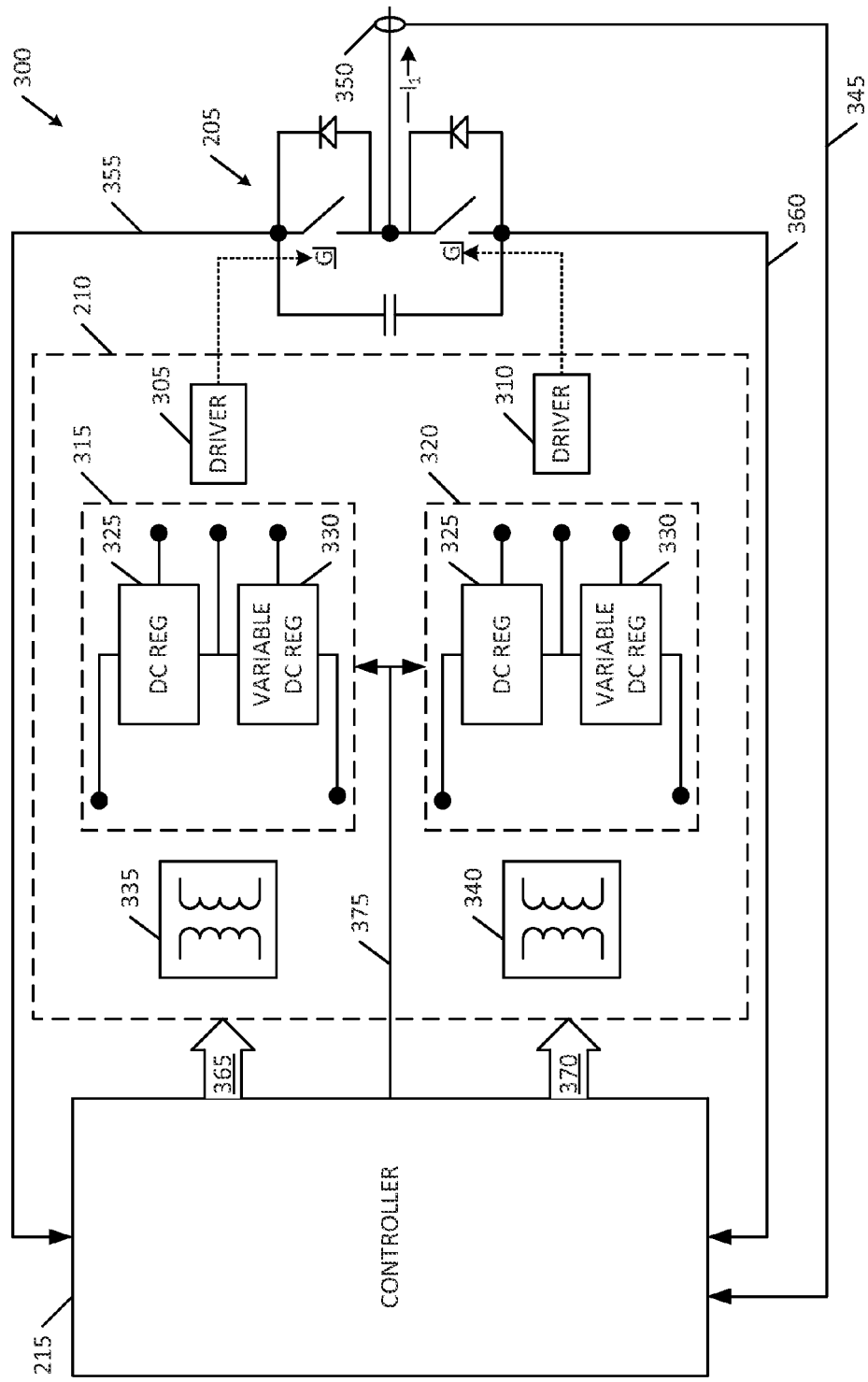
FIG. 3 is a block schematic diagram of a particular implementation of the semiconductor driver system shown in FIG. 2.

FIG. 3 is a block schematic diagram of a particular implementation system 300 of the inverter system shown in FIG. 2. System 300 includes inverter 205, gate driver 210, and controller 215. System 300 includes specific implementations of gate driver 210.

Gate driver 210 includes a first driver IC 305 and a second driver IC 310 (each of which include an isolated IGBT or MOSFET gate driver IC). Gate driver 210 also includes a high side DC bias supply regulation mechanism 315 and a low side DC bias supply regulation mechanism 320. Each regulation mechanism includes a pair of voltage regulators (e.g., DC voltage regulators): a fixed positive rail voltage regulator 325 and a variable negative rail voltage regulator 330. Regulator 325 is coupled to regulator 330 to produce a regulated fixed positive rail voltage and a regulated variable negative rail voltage referenced to a common reference node (reference node voltage set at about zero volts). The regulation mechanisms are each responsive to a variable regulator signal provided from controller 215 to set the particular level of the negative rail voltage. Gate driver 210 further includes a high-side DC bias isolation and Buck/Boost stage 335 and a low-side DC bias isolation and Buck/Boost stage 340.

System 300 must be fully isolated which is achieved by the isolation stages. These isolations stages create an isolated DC voltage that remains higher than the sums of the magnitudes of both the positive and negative voltage rails at any given time.

In a preferred implementation, the coupled regulators receive a 30 Volt DC input voltage and regulate it to provide a fixed positive rail voltage at about +15 VDC with respect to the reference node and a variable negative rail voltage at about 0 VDC to −15 VDC with respect to the reference node. Controller 215 operates generally as described in the discussion herein concerning the apparatus shown in FIG. 2. Controller 215 includes a set of inputs and a pair of outputs. A first input includes a sampled drive sinusoidal current ($I_1$) provided over a driver current communication path 345 from a current sensor 350. A second input includes a bus voltage across the DC link capacitance (the bus voltage including bus+ and bus− voltages). The bus voltage is provided by a bus+ communication path 355 and a bus− communication path 360. A first output provides high-side PWM signals over a high-side drive path, represented by communication path 365 and provides low-side PWM signals over a low-side drive path, represented by communication path 370. A second output includes analog or serial data output for controlling the variable regulator mechanism of gate driver 210 over a regulator communication path 375.

Preferably the drive current is oversampled at least about twice as fast as the PWM switching frequency which requires a fast processing element. This processing element may include a fast DSP or a fast PIC microcontroller or the like. Dynamic control of the negative rail voltage in substantially real time in response to instantaneous drive current as described herein is a very accurate embodiment. In some implementations, the associated expense and complexity of such achieving such accuracy may not be warranted or desired. Others of the implementations are available as also described herein which may be less accurate (but accurate "enough") while decreasing costs and/or complexity.

Figure 4:
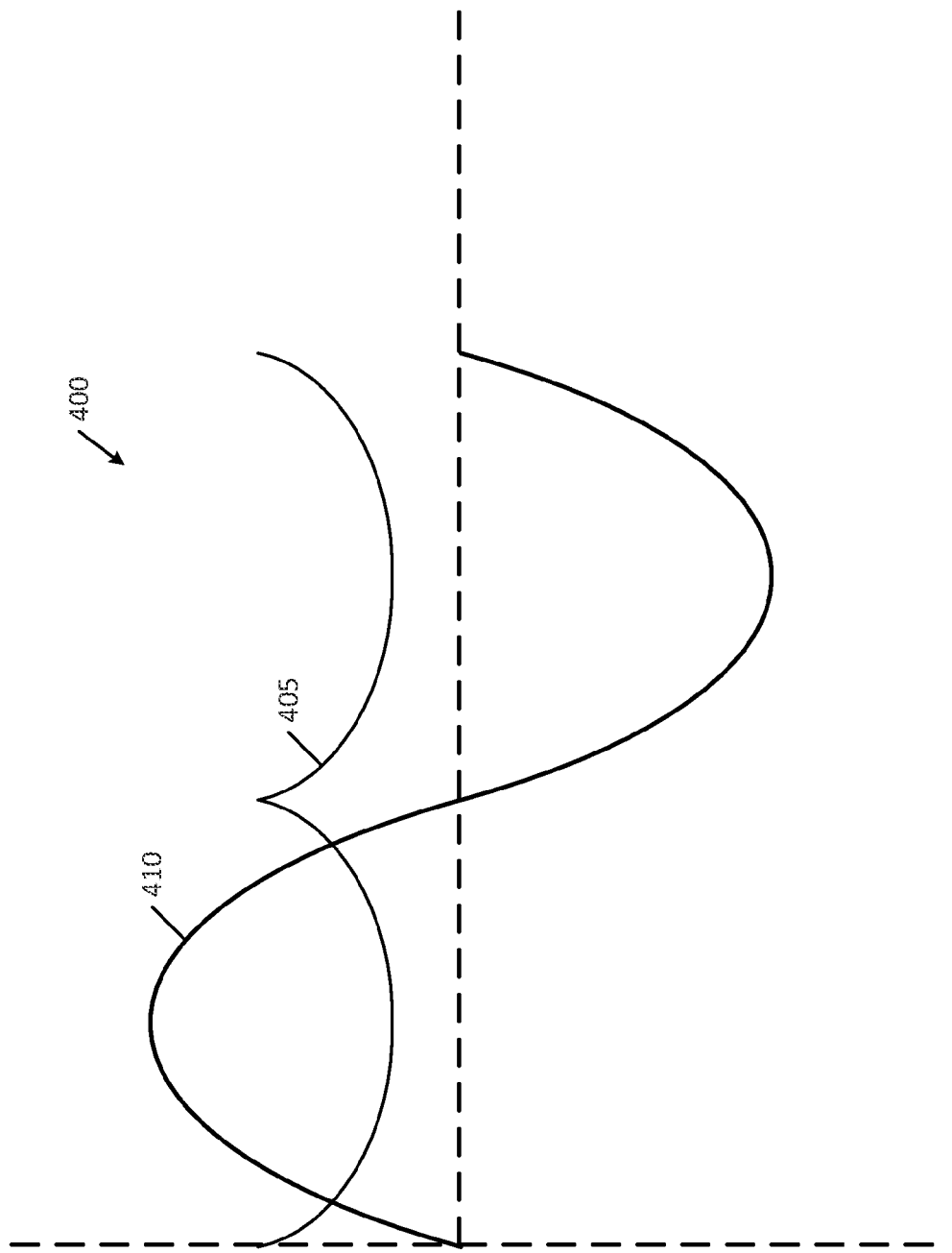
FIG. 4 is a chart plotting bias voltage variation as a function of drive current for the system shown in FIG. 3.

FIG. 4 is a chart 400 plotting bias voltage variation 405 as a function of drive current 410 for the system 300 shown in FIG. 3. Chart 400 illustrates a general relationship between variation 405 and drive current 410 for some embodiments of the present invention. Actual values for the required maximum bias voltage versus drive current will require some device testing/modeling; the plot is shown for representation of the control methodology. Note that bias voltage 405 is a continuous function of measured instantaneous drive current 410.

Figure 5:
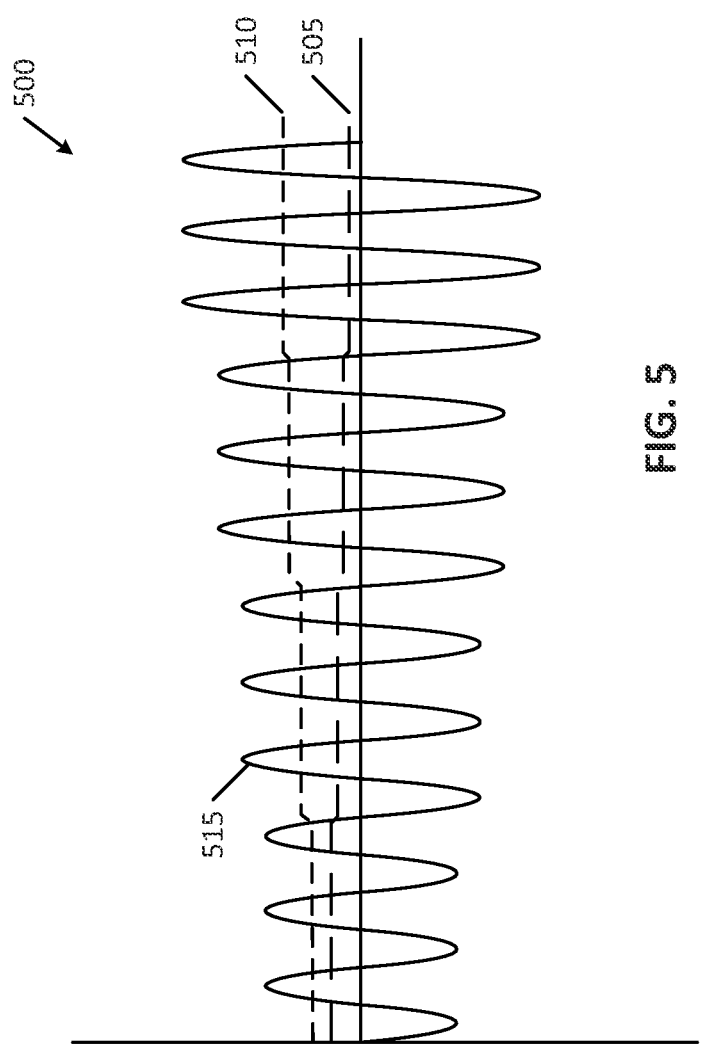
FIG. 5 is a chart plotting bias voltage variation as a function of filtered drive current for an alternate implementation.

An alternative to the specific implementation of system 300 is described by use of FIG. 5. FIG. 5 is a chart 500 plotting bias voltage variation 505 as a function of filtered drive current 510. Filtered drive current 510 is the result of low-pass filtering instantaneous time-varying drive current 515. System 300 is modified to low-pass filter not just drive current 515 but also the bus voltage to produce the rms drive current signal 510. Threshold values for drive current and bus voltage are chosen so that whenever a calculated overshoot caused by a peak of the RMS drive current is too high for the measured bus voltage, the magnitude of the gate drive negative bias rail is lowered to a value where the bus voltage plus overshoot meets the device voltage rating. Low pass filtering the bus voltage (in those cases where it is always positive) provides the average DC value of the bus voltage. However, since the current is sampled, the rms current will be calculated in the digital domain, then low-pass filtered to extract out the fundamental rms current. The RMS value of AC voltage and current are defined as the DC voltage and current value that can generate the same amount of power on a pure resistance. RMV refers to a Rectified Mean Value and is an alternative method to measure/calculate/estimate RMS: for non-distorted sinusoidal input, RMV and RMS are the same. As used herein, RMS and RMV will be used interchangeably, unless the specific context indicates otherwise.

In some cases, low-pass filtering introduces delays in adjustments for reducing risks of voltage overshoot, such as the dynamic adjustment to the regulation mechanisms described herein. To accommodate these implementations, sometimes it is necessary and/or desirable to include operational margins to ensure that the overshoot has not destroyed the device before the dynamic adjustment has occurred. Solutions including low-pass filtering will, in general, have slower operation and preferably will include a suitable margin. Many of these solutions may be simpler and/or less expensive to implement.

Figure 6:
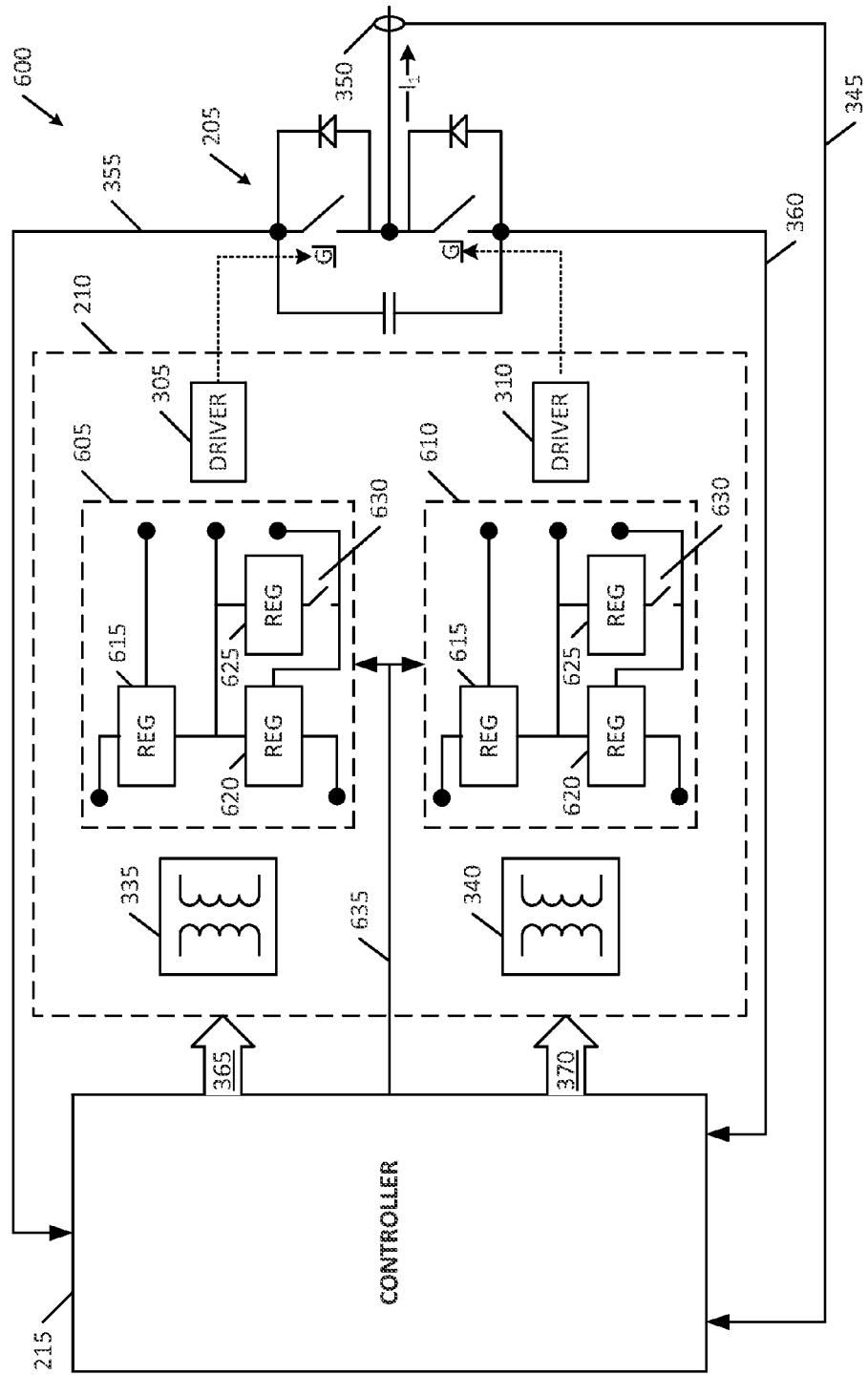
FIG. 6 is a block schematic diagram of a particular implementation of the semiconductor driver system shown in FIG. 2.

FIG. 6 is a block schematic diagram of a particular implementation system 600 of the semiconductor driver system shown in FIG. 2. System 600 differs primarily in the nature of the regulator mechanisms and, consequently, details of the controller signals. Specifically, gate driver 210 of system 600 includes a high side DC bias supply regulation mechanism 605 and a low side DC bias supply regulation mechanism 610. Each regulation mechanism includes a trio of voltage regulators (in contrast to the pair of voltage regulators used in system 300): a fixed positive rail DC regulator 615, a first negative rail DC regulator 620, and a second negative rail DC regulator 625. Regulator 615 is coupled to regulator 620 to produce a regulated fixed positive rail voltage and a regulated variable negative rail voltage referenced to a common reference node (reference node voltage set at about zero volts). A semiconductor switch 630 couples second regulator 625 to the negative voltage rail bus. The regulation mechanisms are each responsive to a digital regulator signal provided from controller 215 to set the particular level of the negative rail voltage. Gate driver 210 further includes a high-side DC bias isolation and Buck/Boost stage 335 and a low-side DC bias isolation and Buck/Boost stage 340.

With switch 630 open, the regulation mechanisms are configured in a first operational mode for low switching losses (e.g., fastest switching speeds having greatest induced voltages). With switch 630 closed, the regulation mechanisms are configured in a second operational mode for adjusting the negative rail voltage to a level determined to adequately address any risk from potential voltage overshoot. The controller signal to the regulator mechanisms are provided via a communication path 635. The controller signal in this case includes a single logic high (or low) signal to control switches 630 and to set the operational mode of the regulation mechanisms.

Compared to the systems described herein in connection with system 300, system 600 may be implemented with a simpler, more cost effective controller. System 300 preferably has a fast DSP or PIC processor for oversampling the instantaneous drive current and bus voltage across the DC Link capacitance and for providing a real-time dynamic controller signal stream that constantly adjusts the negative rail voltage. System 600 may include a simpler/slower DSP/PIC processor or other control mechanism. As shown and described, system 600 uses instantaneous drive current measurement for setting the controller signals. However, a low-pass implementation is possible similar to that described in context of FIG. 4. When configuring the regulator mechanisms, the voltage level of second regulator 630 is selected to guarantee (in the preferred embodiment) that the overshoot responsive to a worst case drive current at a maximum bus voltage meets the device voltage requirements. As the switching speed increases, associated losses with embodiments like this reduces/eliminates some associated switching losses.

Figure 7:
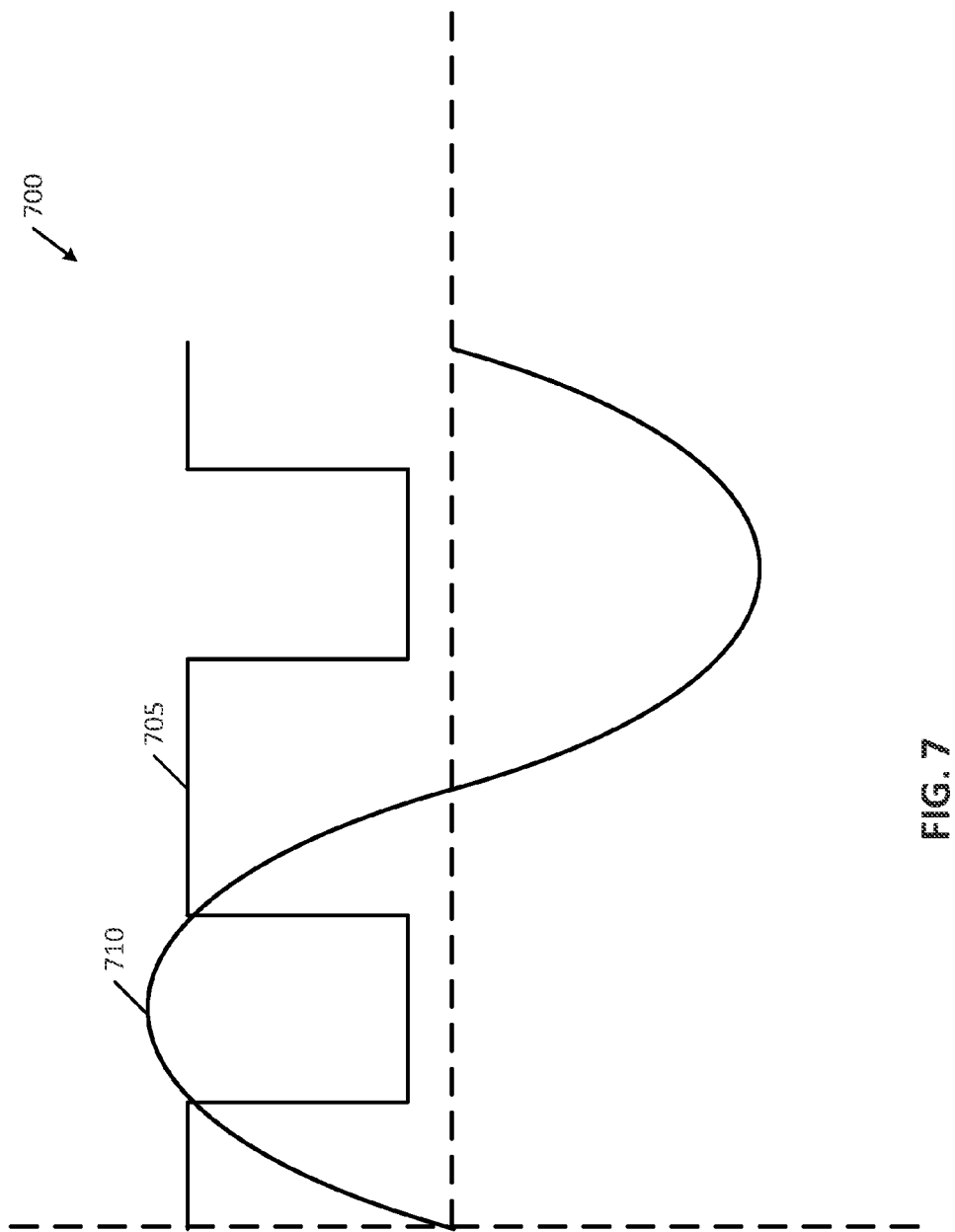
FIG. 7 is a chart plotting stepped bias voltage variation as a function of drive current for the system shown in FIG. 6.

FIG. 7 is a chart 700 plotting stepped bias voltage variation 705 as a function of drive current 710 for the system shown in FIG. 6. Negative gate drive bias voltage rail fluctuates as a function of drive current 710, with chart 700 illustrating a representative relationship. Control of the two negative gate drive bias voltages is based on the measured instantaneous phase current, such as described in association with system 300. Actual values for the two discrete bias voltages are determined based upon a preferred specific embodiment, implementation, and/or application and therefore typically includes some device testing. Chart 700 is only used for depiction of the control methodology. The higher (magnitude) bias voltage should be chosen to minimize switching losses, while the lower bias voltage should limit all phase currents which surpass device ratings at a measured bus voltage.

Figure 8:
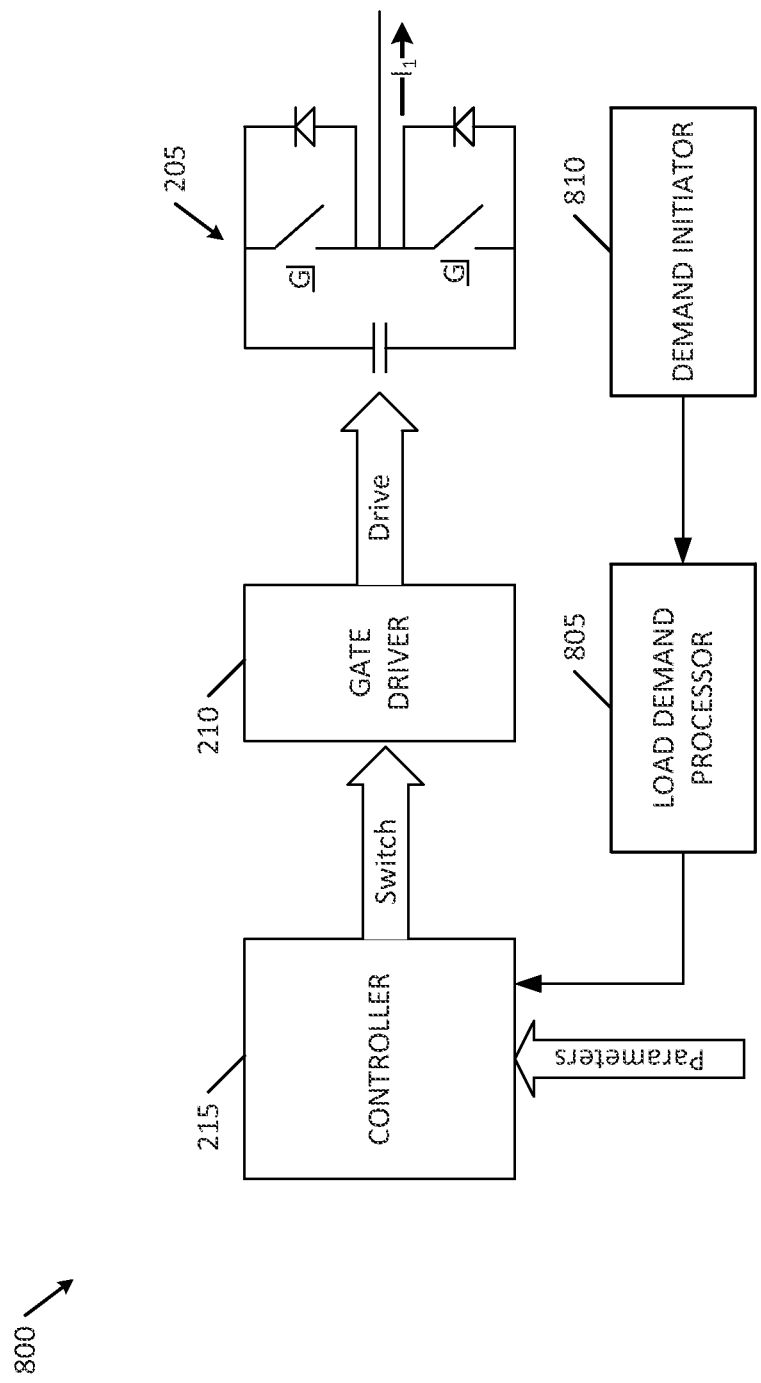
FIG. 8 is a general block schematic diagram of a semiconductor driver system similar to the system shown in FIG. 2, with the inclusion of a load demand processor.

In the systems and methods described herein, it is possible to include additional parameters, or different parameters. For example, the systems described herein, for example system 200 of FIG. 2, may be described with more specificity to provide context for additional embodiments of the present invention. FIG. 8 is a general block schematic diagram of a power driver system 800 similar to system 200 shown in FIG. 2, with the inclusion of a load demand processor 805 and a demand initiator 810. Processor 805 may represent, for example, a user interface for issuing commands to the system in order for the user to influence the drive current $I_1$. A simple example is when inverter 205 is a current control for one phase of a multiphase electric motor. Collectively, the drive current from all phases influences a speed of the electric vehicle. Demand initiator 810 represents a control to initiate a change to the load demand. For example, some type of speed/acceleration control (e.g., demand initiator 810) is ultimately provided and interactive with load demand processor 805 to set the drive current. The earlier that the signal is sampled for the applicable controller parameter yields more time for the system to react, which can mean that slower, low-cost components may be able to be used.

It is the case that additional parameters from load demand processor may be used to anticipate an increased risk of the potential transitory voltage overshoot condition. For example, when load demand processor 805 commands a drastically increased drive current (e.g., responsive to a user "flooring" the acceleration control) one or more parameters from load processor 805 indicate that an increased risk of dangerous overshoot is, or may be, imminent. The actual parameter may be a signal indicative of throttle 810 (e.g., foot pedal) position or a signal derived from such a signal, or some other signal indicative of an expected magnitude for the drive current determined from the user or other system associated with the drive current generation.

In other words, load demand processor 805 activates desired gate drive voltage rail selection based on expected drive current. A primary function of controller 215 is to regulate the drive current (e.g., motor current) to generate the required results (e.g., speed of the EV). When the DSP controlled target torque requires more current than can be allowed based on calculated voltage overshoot, the DSP adjusts the negative gate rail. This method may not achieve the lowest possible power dissipation, but will work with slower processors or slower current sensors.

Figure 9:
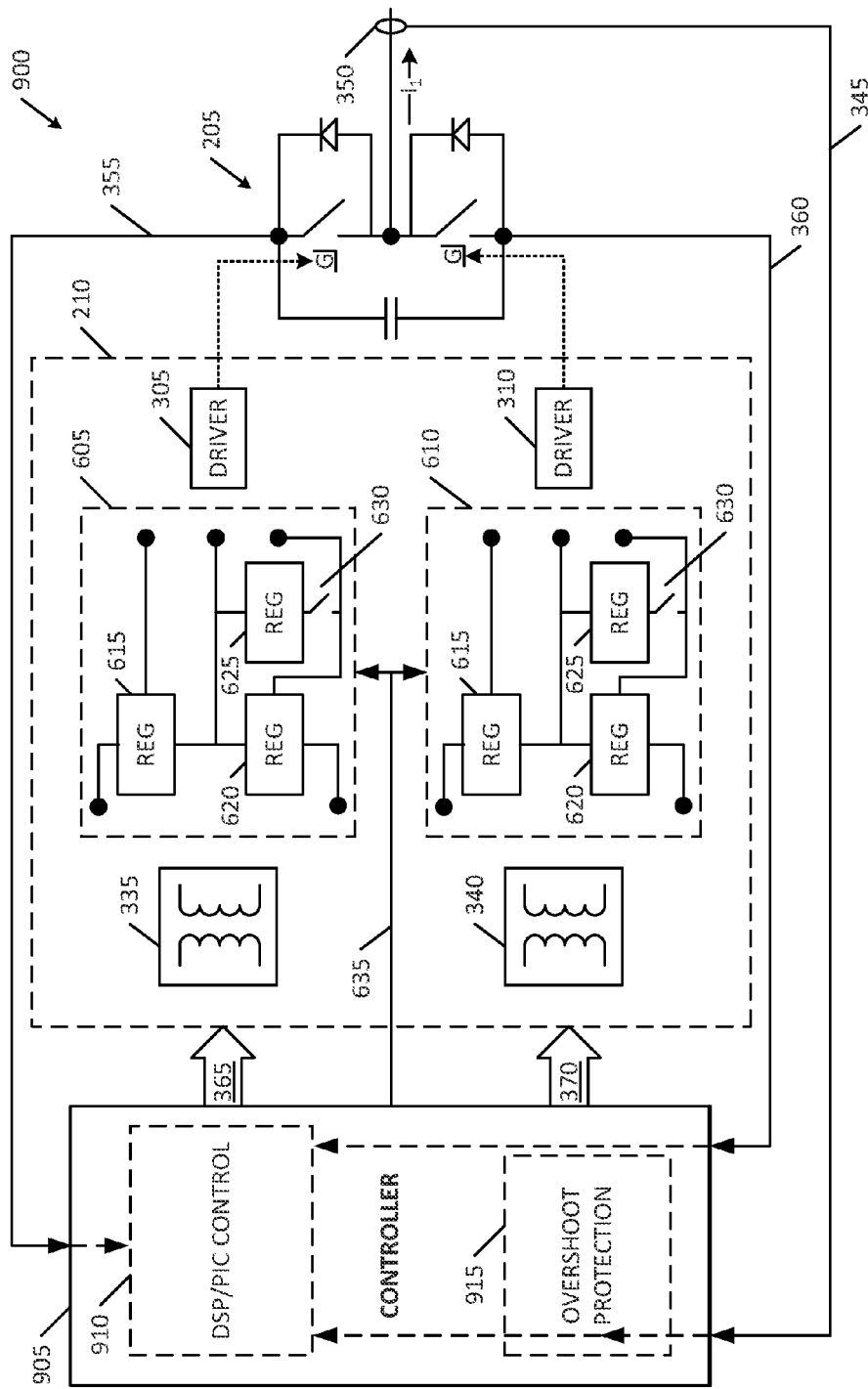
FIG. 9 is a block schematic diagram of a particular implementation system of the semiconductor driver systems shown herein.

FIG. 9 is a block schematic diagram of a particular implementation system 900 of the semiconductor driver systems shown herein, with system 600 being similar except for the modification to the controller and additional consequential changes flowing from the change in the controller.

System 900 includes a controller 905 including both a programmatic controller element 910 (DSP, PIC microcontroller, and the like) similar to the other preferred embodiments for controlling the high-side and low-side PWM signals and a discrete hardware element 915 controlling the single-bit (or hardware-derived analog voltage or the like) regulator signal provided on communication path 635 to the regulation mechanisms of the gate driver 210. Discrete hardware element 915 includes elements (integrated and/or discrete) providing and setting the regulator signal. The state of the regulator signal sets the operational mode (and the negative rail voltage) of the regulator mechanisms. System 900 may be configured as shown for measuring and responding to instantaneous drive current and bias bus voltages or may be responsive to low-pass filtered drive current measurements. Element 915 is shown as part of the control mechanism in the broad sense. As noted herein, the actual components of element 915, however configured, may be physically associated with other elements besides that controller generating the PWM signals. Element 915 is a control mechanism for the overvoltage protection system but is not necessarily integrated/physically associated with other control mechanisms.

The gate drive rail selection is preferably determined based on a filtered RMS drive current signal, where the RMS current is directly input to a comparator with a threshold that allows safe operation under all expected bus voltages for the system. Some embodiments and implementations may include a low pass filter on the comparator output to reduce a rate of change on the negative rail selection. This configuration has advantages in some embodiments because no DSP is required for evaluation and control of the negative rail voltage, and the overshoot is reduced via a hardware system rather than a software system. The low pass filter may require extra margin however.

Figure 10:
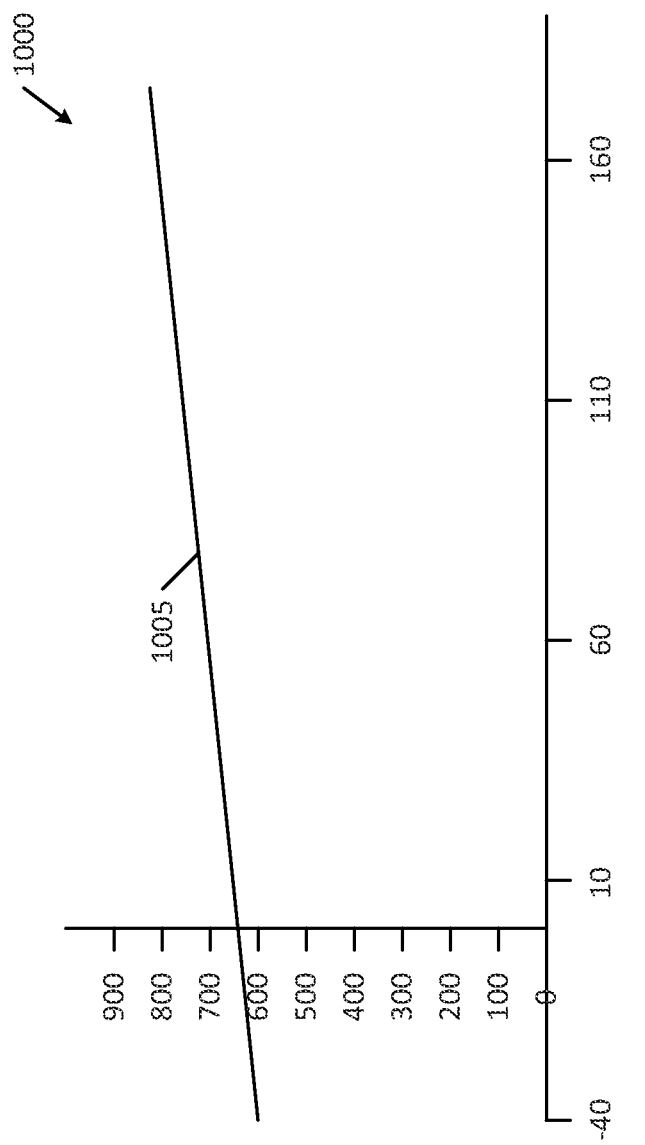
FIG. 10 is a chart plotting device breakdown voltage as a function of device junction temperature.

FIG. 10 is a chart 1000 plotting device breakdown voltage 1005 as a function of device junction temperature. The breakdown voltage of IGBTs and MOSFETs is a function of the junction temperature of the devices. In the embodiments and implementations of the present invention, including those described herein, one of the parameters used by controller 215 could include a junction temperature (measured, calculated, estimated, or determined in some other fashion) of one or more devices in the heat rejection path. The negative voltage rail voltage is varied as a function of the junction temperature. For IGBTs and MOSFETs, typical device curves depict increasing breakdown voltages as the junction temperature increases. When the bus voltage is kept constant, a higher device operating temperature allows for additional overshoot voltage headroom. In some instances, it may be possible to achieve greater overall efficiencies by permitting device temperatures to increase (e.g., not cool as much) which saves energy directly from the costs saved in foregone cooling and indirectly by permitting fast switching over a greater range of drive current variation. It is the case that most manufacturer's specify the device breakdown voltage at about −40 C with the breakdown voltage rising with increased temperature. Specific characterization of this relationship and monitoring of junction temperature enables improved, more efficient operation.

Figure 11:
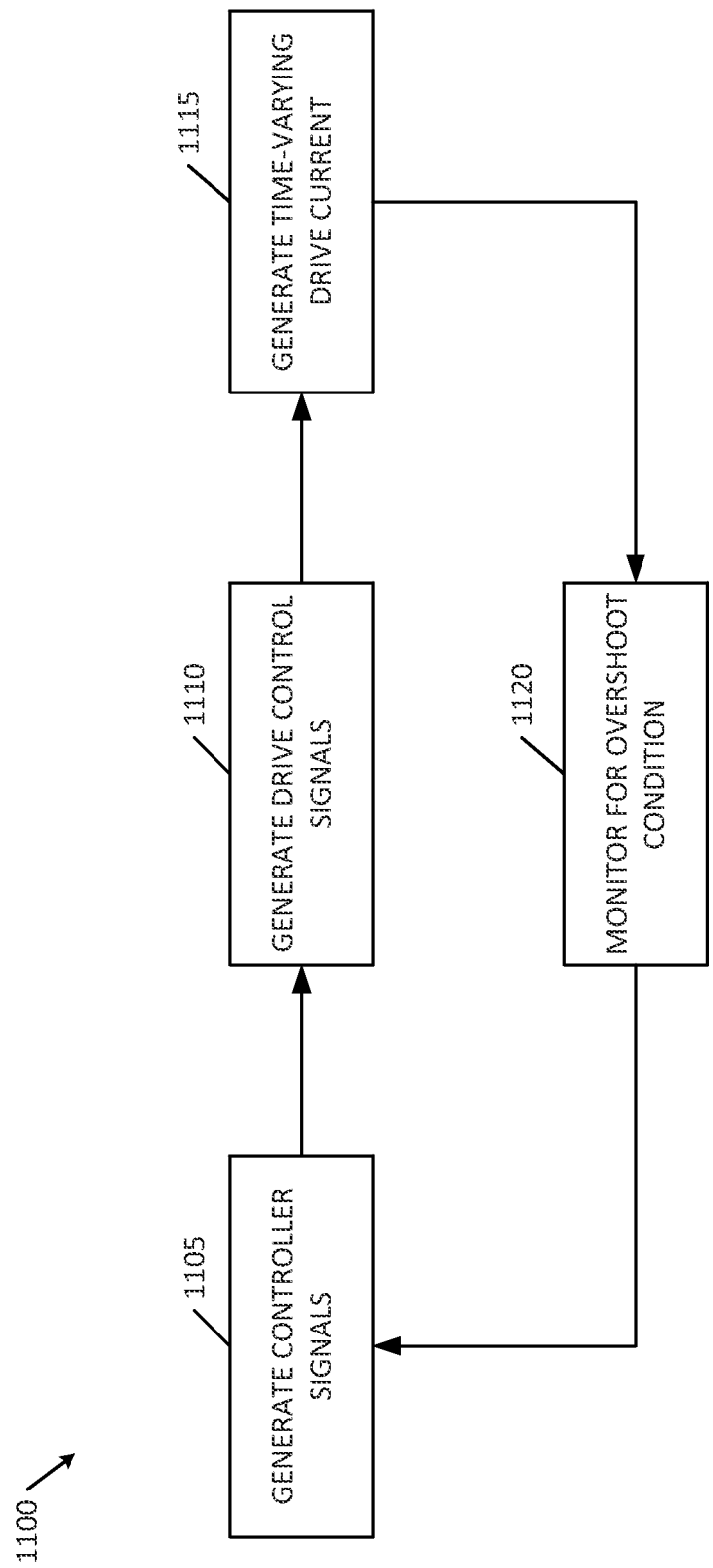
FIG. 11 is a generic process flow diagram for reducing a risk of exceeding a breakdown voltage of a half-bridge semiconductor power drive.

FIG. 11 is a generic process flow diagram for a process 1100 to reduce a risk of exceeding a breakdown voltage of an inverter power drive. Process 1100 includes a series of general steps. Step 1105 generates one or more controller signals, step 1110 generates one or more drive control signals responsive to the one or more controller signals. The one or more drive control signals operate, at step 1115, a current driver to generate a time-varying drive current $I_1$. Step 1120 monitors one or more parameters for a possibility of an overshoot condition (the parameters of the preferred embodiment including drive current and bus voltage across a DC Link capacitance of the current driver (instantaneous or low-pass filtered). Step 1105 of process 1100 uses the monitored parameters in the generation of the controller signals. The controller signals are dynamically set responsive to the parameters to handle potential voltage overshoot.

Figure 12:
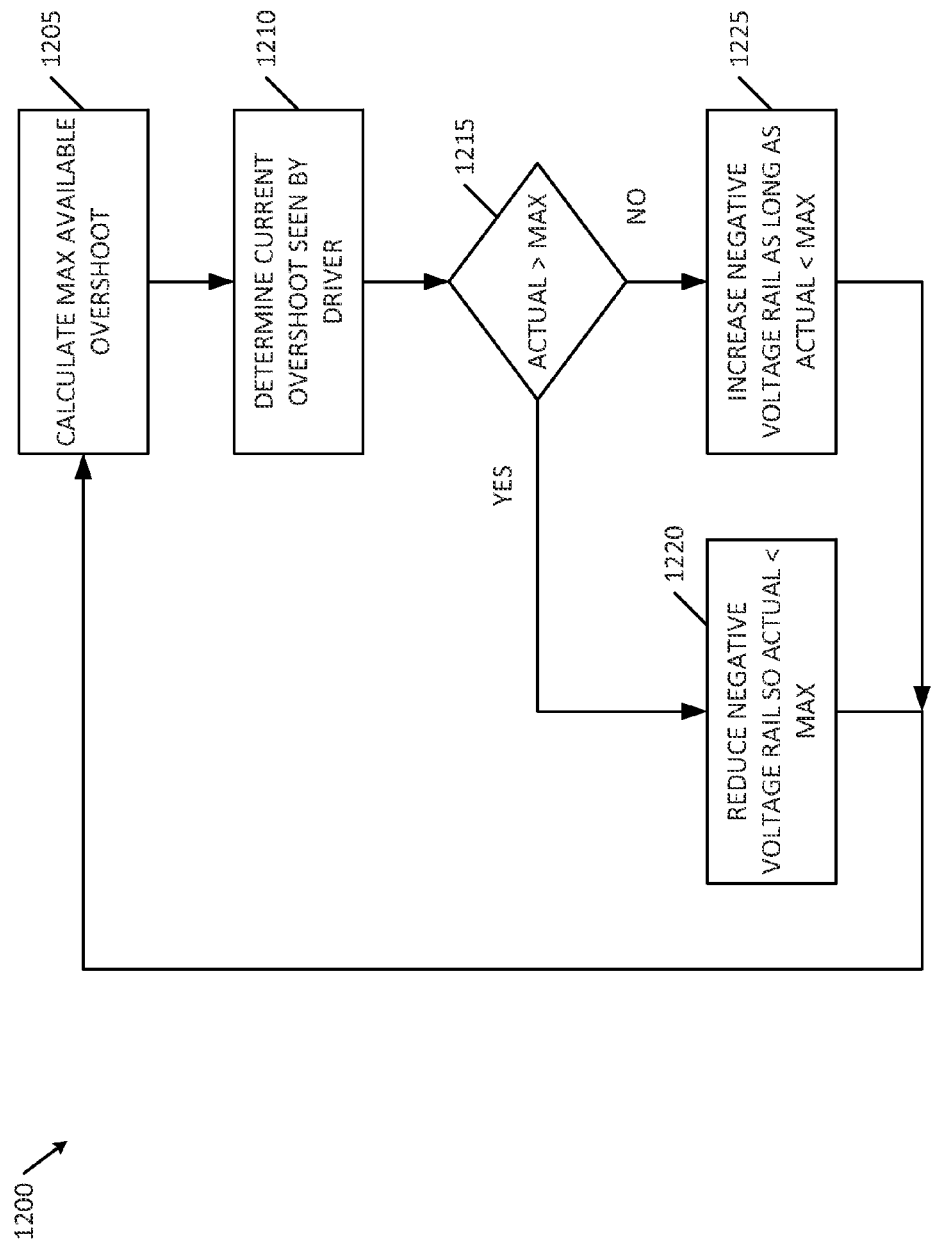
FIG. 12 is a more detailed process flow diagram for operation of the system shown in FIG. 3.

FIG. 12 is a detailed process 1200 diagram for operation of a specific system, such as shown in FIG. 3. Process 1200 first calculates a maximum available overshoot. For example, $V_{Overshoot\_MAX} = V_{Device\_Rating} - V_{DClink}$. $V_{DClink}$ is measured and $V_{Device\_Rating}$ is predetermined, though as noted herein it may be a function of one or more parameters of the system, such as a junction temperature of the drive transistors.

Following step 1205, process 1200 includes step 1210 to determine the overshoot voltage seen by the current driver. In the preferred embodiment, this may be done by accessing a pre-calculated lookup table that provides a particular value for $V_{Overshoot}$ given a value for the drive current $I_1$ at a particular magnitude (e.g., maximum) of the negative voltage rail. In the preferred embodiment, the lookup table uses instantaneous drive current, though as described herein, a low-pass filtered drive current may be used by some embodiments.

After step 1210, process 1200 tests whether $V_{Overshoot}$ is larger than $V_{Overshoot\_MAX}$. This test may not be a separate discrete test but may be part of decision logic in implementing one or more other steps of process 1200. When the test at step 1215 is "YES" process 1200 executes step 1220 to reduce the negative voltage rail so that the actual overshoot voltage is less than $V_{Overshoot\_MAX}$. When the test at step 1215 is "NO" process 1200 executes step 1225 which determines whether to increase the negative voltage rail as long as the actual overshoot voltage remains less than $V_{Overshoot\_MAX}$. Following execution of either step 1220 or step 1225, process 1200 returns to step 1205 to recalculate $V_{Overshoot\_MAX}$.

Not shown in FIG. 12 is that the controller issues controller signals (PWM and regulation mechanism controls) to dynamically adjust the system (e.g., the negative rail voltage in the preferred embodiments) to limit/reduce/eliminate a risk of a potential overshoot condition. The controller signals may include an analog voltage signal, or a digital serial communication signal, or a single-bit logic signal to control a variable regulation mechanism (preferably implemented with one or more variable voltage regulators coupled to the negative voltage rail). Also not shown in FIG. 12 is that the process 1200 may include, in some embodiments, a safety feature to protect the drive electronics in the event that the system experiences, will be experiencing, or is estimated to experience, an overshoot condition that is simply too large to for all available negative rail bias voltages. In such a case, drive current $I_1$ must be limited or the bus voltage across the DC link capacitance must limited.

As noted in FIG. 10, it is possible to use a determined junction temperature (estimated, calculated, measured, or otherwise established) as a parameter into the control system to reduce overshoot by varying one or more rail voltages. It is possible to provide an overshoot protection system using junction temperature that does not control the negative voltage rail.

As noted herein, the system and process are most preferably implemented in multiphase current drivers, such as used to provide multiple drive currents for a multiphase electric motor used as a traction device in an EV. In such a case, the systems and method measure the drive current for at least two phases of a three-phase electric motor (the third being known from the other two). Also as noted herein, prior art solutions of using bigger resistances to reduce overshoot are undesirable for several reasons, including that the operation is degraded even at those times when there is no risk (or virtually no risk) of dangerous overshoot conditions. By using some of the selective switching solutions disclosed herein, it is possible to respond to overshoot conditions by switching in suitable resistances when needed, and removing them when not needed.

The system and methods above has been described in general terms as an aid to understanding details of preferred embodiments of the present invention. Other preferred embodiments of the present include the described application for EVs. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. An apparatus addressing a potential transitory overshoot condition in a switch, the apparatus comprising:
   an inverter including a high-side switch coupled to a low-side switch, said inverter generating a time-varying drive current from a plurality of drive control signals, a positive rail voltage, and a negative rail voltage, wherein the apparatus has parasitic inductance, and wherein controlling the switches to generate said time-varying drive current produces a potential transitory overshoot condition for one of said switches of said inverter due to the parasitic inductance;
   a drive control, coupled to said inverter, to generate said drive control signals and to set a level of each of said rail voltages responsive to a plurality of controller signals; and
   a controller monitoring one or more parameters indicative of said potential transitory voltage overshoot condition, said controller dynamically adjusting, responsive to said monitored parameters, said controller signals to reduce a risk of occurrence of said potential transitory voltage overshoot condition despite the parasitic inductance in the apparatus;
   wherein said parameters include one or more signals in anticipation of said potential transitory voltage overshoot condition.

2. The apparatus of claim 1 wherein said controller signals produce an increased risk of said potential transitory voltage overshoot condition responsive to a load demand processor commanding an increase in a magnitude of said time-varying drive current.

3. The apparatus of claim 2 further comprising an electric motor of an electric vehicle, said motor including a winding coupled to an output of said multi-stage inverter and wherein said load demand processor includes a motor controller for regulating said drive current to control a torque of said motor and wherein said controller signals are responsive to an expected magnitude for said drive current determined from said one or more parameters.

4. The apparatus of claim 1 wherein one or more of said parameters are converted to a root mean square signal or a rectified mean signal and wherein said controller signals are generated responsive to said root mean square signal or to said rectified mean signal.

5. The apparatus of claim 1 wherein said controller signals include a first series of high-side pulse width modulation (PWM) signals and second series of low-side PWM signals for generation of said time-varying current and wherein said controller signals include a regulator control signal to set said negative voltage rail at a second regulated voltage in a range from about zero volts to less than said negative supply voltage.

6. The apparatus of claim 5 wherein said controller includes a programmatic control element controlling said PWM signals and wherein said controller includes a discrete hardware element controlling said regulator control signal.

7. The apparatus of claim 6 wherein said discrete hardware element includes a comparator having an output providing said regulator control signal wherein said comparator includes a first input receiving a first input voltage derived from said drive current and a second input receiving a preselected voltage threshold to configure said regulator control signal to reduce said risk.

8. The apparatus of claim 7 including a low pass filter coupled to said first input of said comparator.

9. The apparatus of claim 1 wherein said one or more parameters include an estimate of a junction temperature of one or more said components in a heat rejection path of said inverter and wherein said controller signals are responsive to said junction temperature when setting said negative voltage rail.

10. A method addressing a potential transitory overshoot condition in a switch, the method comprising the steps of:
   a) generating, in a system comprising an inverter with at least one switch, a time-varying drive current from a plurality of drive control signals, a positive rail voltage, and a negative rail voltage, wherein the system has parasitic inductance, and wherein said time-varying drive current produces a potential transitory overshoot condition for the switch of the inverter due to the parasitic inductance;
   b) generating, using the system, said drive control signals and setting a level of one or more of said rail voltages for said inverter responsive to a plurality of controller signals;
   c) monitoring, using the system, one or more parameters indicative of said potential transitory voltage overshoot condition; and
   d) adjusting, using the system, dynamically, responsive to said monitored parameters, said controller signals to at least reduce a risk of occurrence of said potential transitory voltage overshoot condition despite the parasitic inductance in the system;
   wherein said monitoring step c) includes evaluating one or more parameters anticipating a change to said drive current.

11. The method of claim 10 further comprising a load demand processor for initiating a response to a request for increased drive current wherein said one or more parameters include said request for increased drive current.

12. The method of claim 11 further comprising an electric motor for an electric vehicle responsive to said drive current to set a torque of said electric motor and wherein said load demand processor includes a motor control for initiating said request for increased drive current.

13. The method of claim 11 further comprising an electric motor for an electric vehicle responsive to said drive current to set a torque of said electric motor and wherein said load demand processor is responsive to a user-controlled throttle control for said electric motor.

14. A method addressing a potential transitory overshoot condition in a switch, the method comprising the steps of:
   a) calculating, in a system comprising an inverter with at least one switch, a maximum available voltage overshoot for the inverter producing a time-varying drive current, wherein the system has parasitic inductance;
   b) determining, using the system, a current voltage overshoot for said inverter responsive to said time-varying drive current;
   c) operating, using the system, said inverter in a first operational mode for minimization of switching losses when said current voltage overshoot is not greater than said maximum available voltage overshoot while increasing a risk of occurrence, due to the parasitic inductance, of a potential transitory voltage overshoot condition destructive to said inverter; and
   d) operating, using the system, said inverter in a second operational mode for reduction of said risk of occurrence of said potential transitory voltage overshoot condition, despite the parasitic inductance in the system, when said current voltage overshoot is greater than said maximum available voltage overshoot while increasing switching losses,
   wherein said determining step b) includes evaluating one or more parameters anticipating a change to said drive current.

15. The method of claim 14 further comprising a load demand processor for initiating a response to a request for increased drive current wherein said one or more parameters include said request for increased drive current.

16. The method of claim 15 further comprising an electric motor for an electric vehicle responsive to said drive current to set a torque of said electric motor and wherein said load demand processor includes a motor control for initiating said request for increased drive current.

17. The method of claim 15 further comprising an electric motor for an electric vehicle responsive to said drive current to set a torque of said electric motor and wherein said load demand processor is responsive to a user-controlled throttle control for said electric motor.

18. The method of claim 14 further comprising the step of:
   e) low pass filtering one or more parameters used in said calculating step a) to produce an rms current signal;
   wherein said determining step b) is responsive to said rms current signal.

19. The method of claim 14 further comprising the steps of:
   e) low pass filtering said one or more parameters to produce an rms current signal;
   f) comparing said rms current signal to a predetermined threshold allowing non-risky operation for a predetermined range of said rail voltages to produce an comparator output signal;
   wherein said determining step b) is responsive to said comparator output signal.

20. The method of claim 12 further comprising the step of:
   e) estimating a junction temperature of a device in a heat rejection path of said inverter;
   wherein said available voltage overshoot is responsive to said junction temperature.

* * * * *